United States Patent
Takehara et al.

(10) Patent No.: US 10,365,320 B2
(45) Date of Patent: Jul. 30, 2019

(54) FAILURE ESTIMATION APPARATUS AND FAILURE ESTIMATION METHOD

(71) Applicant: Renesas Electronics Corporation, Tokyo (JP)

(72) Inventors: Yuji Takehara, Tokyo (JP); Takeo Mimura, Tokyo (JP); Tomohiro Oono, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 445 days.

(21) Appl. No.: 15/168,837

(22) Filed: May 31, 2016

(65) Prior Publication Data
US 2017/0023634 A1 Jan. 26, 2017

(30) Foreign Application Priority Data
Jul. 22, 2015 (JP) .................... 2015-144584

(51) Int. Cl.
  *G01R 31/26* (2014.01)
  *G01R 31/28* (2006.01)
  (Continued)

(52) U.S. Cl.
  CPC ..... *G01R 31/2642* (2013.01); *G01R 31/2608* (2013.01); *G01R 1/0458* (2013.01);
  (Continued)

(58) Field of Classification Search
  CPC ............ G01R 31/2608; G01R 31/2642; G01R 31/2874; G01R 31/2875; G01R 31/2817; G01R 1/0458; G01R 1/06777
  (Continued)

(56) References Cited

U.S. PATENT DOCUMENTS

| 9,500,693 B2 | 11/2016 | Monda et al. |
| 2009/0077508 A1* | 3/2009 | Rubin ............ G01B 31/318357 716/136 |

(Continued)

FOREIGN PATENT DOCUMENTS

| JP | 2004-268633 A | 9/2004 |
| JP | 2011-196703 A | 10/2011 |
| JP | 2013-104843 A | 5/2013 |

OTHER PUBLICATIONS

Japanese Office Action issued in corresponding Japanese Patent Application No. 2015-144584, dated Apr. 2, 2019, with English Translation.

*Primary Examiner* — Sujoy K Kundu
*Assistant Examiner* — Lynda Dinh
(74) *Attorney, Agent, or Firm* — McDermott Will & Emery LLP

(57) ABSTRACT

There is a need to improve estimation accuracy of a failure estimation method or its failure estimation apparatus that performs failure estimation on a targeted instrument based on history information about several instruments mounted with the same type of semiconductor device as an instrument targeted at failure estimation. A failure estimation apparatus that includes a history information database storing history information about a plurality of instruments mounted with the same type of semiconductor device and performs failure estimation on a targeted instrument mounted with a semiconductor device whose type equals the type, wherein the history information contains operation information and failure information; wherein the operation information indicates a chronological operating state of the semiconductor device mounted on the instruments; wherein the failure information indicates a failure cause of a failed instrument; and wherein the operating state is categorized into a plurality of classifications.

18 Claims, 13 Drawing Sheets

(51) Int. Cl.
*G01R 1/067* (2006.01)
*G01R 1/04* (2006.01)

(52) U.S. Cl.
CPC ...... *G01R 1/06777* (2013.01); *G01R 31/2817* (2013.01); *G01R 31/2874* (2013.01); *G01R 31/2875* (2013.01)

(58) Field of Classification Search
USPC .......................................................... 702/58
See application file for complete search history.

(56) References Cited

U.S. PATENT DOCUMENTS

| | | | | |
|---|---|---|---|---|
| 2009/0287909 | A1* | 11/2009 | Vera ...................... | G06F 11/008 712/220 |
| 2011/0288808 | A1* | 11/2011 | Fan ..................... | G01R 31/2894 702/118 |
| 2012/0191384 | A1* | 7/2012 | Kalgren .................. | G01D 3/08 702/58 |
| 2016/0266819 | A1* | 9/2016 | Sundell ..................... | G06F 1/26 |

* cited by examiner

| CLASSIFICATION | DESCRIPTION | EXAMPLE |
|---|---|---|
| A | THE TEMPERATURE MOST FREQUENTLY CHANGES FROM 0°C TO 10°C |  |
| B | THE TEMPERATURE MOST FREQUENTLY CHANGES FROM 11°C TO 20°C |  |
| C | THE TEMPERATURE MOST FREQUENTLY CHANGES FROM 21°C TO 30°C |  |
| D | THE TEMPERATURE MOST FREQUENTLY CHANGES FROM 31°C TO 40°C |  |

| CLASSIFICATION | COMPUTING REMAINING LIFE |
|---|---|
| A | REMAINING LIFE $= $ PRODUCT LIFE $- R_{A1}X_1 - R_{A2}X_2 - R_{A3}X_3 - R_{A4}X_4 - ...$ |
| B | REMAINING LIFE $= $ PRODUCT LIFE $- R_{B1}X_1 - R_{B2}X_2 - R_{B3}X_3 - R_{B4}X_4 - ...$ |
| C | REMAINING LIFE $= $ PRODUCT LIFE $- R_{C1}X_1 - R_{C2}X_2 - R_{C3}X_3 - R_{C4}X_4 - ...$ |
| D | REMAINING LIFE $= $ PRODUCT LIFE $- R_{D1}X_1 - R_{D2}X_2 - R_{D3}X_3 - R_{D4}X_4 - ...$ |

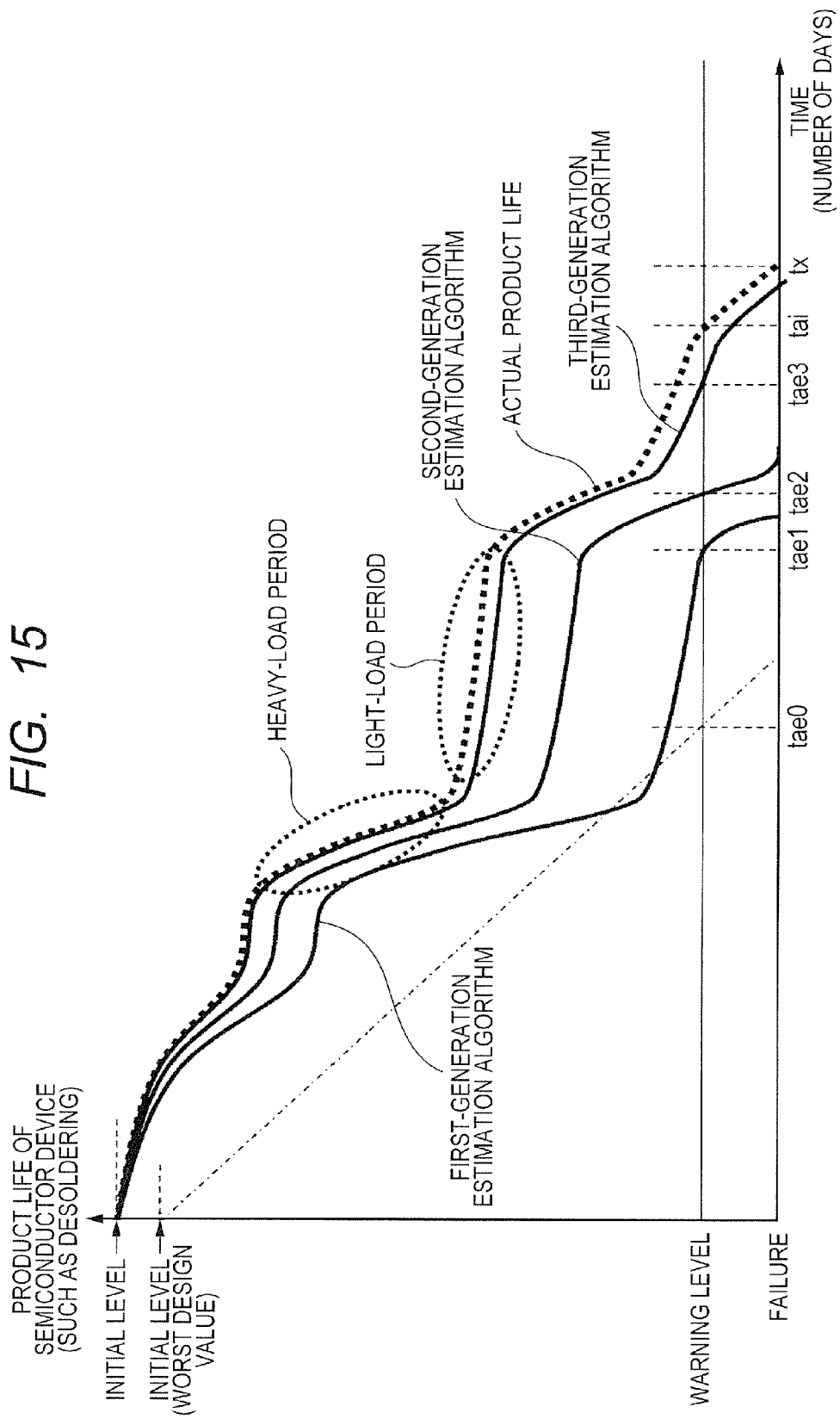

FAILURE ESTIMATION APPARATUS AND FAILURE ESTIMATION METHOD

CROSS-REFERENCE TO RELATED APPLICATIONS

The disclosure of Japanese Patent Application No. 2015-144584 filed on Jul. 22, 2015 including the specification, drawings and abstract is incorporated herein by reference in its entirety.

BACKGROUND

The present invention relates to a failure estimation apparatus and a failure estimation method. More specifically, the invention is favorably applicable to a failure estimation apparatus and a failure estimation method for an apparatus that includes a semiconductor power device.

Recently, the trend of IoT (Internet to Things) is increasing in the field of FA (Factory Automation). For productivity improvement, a FA instrument is networked to manage operating conditions of the instrument such as an operation late and the life. A factory manager (end user) adjusts the replacement availability in the event of a failure or estimates the maintenance time based on information collected from the FA instrument.

The FA instrument uses a power module for motor driving that includes a power semiconductor device (power device). A failure in parts including the power device often causes a serious effect. To avoid this, life estimation is performed to replace parts before an actual failure occurs. It is important to estimate the time to replace a part when the part fails after it is used until failed.

Patent literature 1 discloses a power cycle life estimation method for an IGBT module that includes an insulated gate bipolar transistor (IGBT) as a power device. The method computes the module life by comparing a power cycle life curve resulting from a previously conducted power cycle test with an actual measurement value using a temperature sensor included in the IGBT module. The power cycle test generates a heat stress that increases and decreases the IGBT bonding temperature in a relatively short time. The power cycle test observes characteristics changes until destruction and acquires a power cycle life curve. Patent literature 1 focuses on the fact that the power cycle life curve is formed by several lines with different gradients and includes an inflection point. The life estimation is performed based on the inflection point. This improves the estimation accuracy.

Patent literature 2 discloses a remote vehicle failure estimation system. A failure estimation server previously acquires vehicle data before failure occurrence from a failed vehicle via the network. The failure estimation server relates the acquired vehicle data to vehicle data collected from a failure-estimated vehicle and determines whether or not the failure-estimated vehicle may fail in the near future. Specifically, the server performs correlation operation on vehicle data before failure occurrence acquired from a failed vehicle and vehicle data received from a failure-estimated vehicle. If some degree of correlation is identified in both vehicle data, the server estimates that a failure similar to the failed vehicle occurs. The server notifies the estimation result to a customer of the failure-estimated vehicle and calls his or her attention.

Patent literature 1: Japanese Unexamined Patent Application Publication No. 2011-196703

Patent literature 2: Japanese Unexamined Patent Application Publication No. 2004-268633

SUMMARY

The inventors found the following issues after examining patent literatures 1 and 2.

A factory as an end user of semiconductor devices may use a life estimation function developed by an FA instrument manufacturer to estimate a failure time of built-in parts included in the FA instrument. The accuracy to estimate a failure of each semiconductor device is lower than the other built-in parts. As a reason for this, the FA instrument manufacturer estimates a semiconductor device failure based on a specification supplied from a semiconductor device manufacturer. In consideration of a tolerance, however, the specification is more stringent than an actual specification of the actually mounted semiconductor device. We found that the specification degrades the estimation accuracy so as to estimate the life to be shorter than the actual specification. The invention described in patent literature 1 can improve the estimation accuracy using the estimation based on a power cycle life curve resulting from the previously conducted power cycle test. However, the specification supplied from the semiconductor device manufacturer is also regulated based on the power cycle life curve resulting from the previously conducted power cycle test. We found that the accuracy improvement is limited as far as the failure estimation is based on the power cycle test. After examining the cause of this, the inventors found that the semiconductor device as a life estimation target is mounted on an FA instrument and the FA instrument is used under various conditions that largely differ from the power cycle test. In consideration of the safety, the power cycle test is conducted under the most stringent condition or a comparable condition. For example, the power cycle test requires the temperature change transition that repeatedly increases and decreases the temperature between 80° C. and 150° C. Contrastingly, an actual FA instrument is rarely placed under the most stringent condition in terms of an environment or a load. An actual temperature change transition is considered to increase and decrease the temperature in a narrower temperature range than the temperature change transition according to the power cycle test. We found that the life estimation algorithm for semiconductor devices described in patent literature 1 effectively improves the estimation accuracy but leaves a possibility of further improving the estimation accuracy.

The remote vehicle failure estimation system described in patent literature 2 uses correlation between vehicle data before failure occurrence acquired from a failed vehicle and vehicle data received from a failure-estimated vehicle. The system can be used for an FA instrument mounted with a semiconductor device to collect information such as usage environments or loads on several FA instruments but cannot use the life estimation algorithm described above. The system estimates failures only based on the correlation about usage environments or loads and cannot always ensure the estimation accuracy higher than the life estimation algorithm.

The description below explains measures to solve the issue. The other issues and novel features will become more apparent from the detailed description of the specification given below with reference to the accompanying drawings.

An embodiment is described below.

A failure estimation method or a failure estimation apparatus to perform the failure estimation method estimates failures of instruments based on history information about the instruments mounted with the same type of semiconductor device. The failure estimation method and the failure estimation apparatus are configured as follows.

The history information contains operation information and failure information. The operation information indicates an operating state of the semiconductor device mounted on the instruments. The failure information indicates a failure cause of a failed instrument. The operating state is categorized into several classifications. The failure estimation method stores a program or a formula to implement a life estimation algorithm corresponding to each of the classifications.

The failure estimation method acquires the history information and specifies classification corresponding to an operating state of a semiconductor device mounted on the targeted instrument based on the operation information contained in the acquired history information. When determining that the semiconductor device fails, the failure estimation method updates a life estimation algorithm corresponding to the specified classification based on the acquired history information. When determining that no failure occurs, the failure estimation method performs life estimation using a life estimation algorithm corresponding to the specified classification and notifies a life estimation result.

The description below summarizes an effect of the embodiment.

The embodiment can further improve the estimation accuracy compared to the failure estimation using the life estimation curve based on the power cycle test.

BRIEF DESCRIPTION OF THE DRAWINGS

FIG. 15 is an explanatory diagram illustrating estimation accuracy.

DETAILED DESCRIPTION

Figure 1:
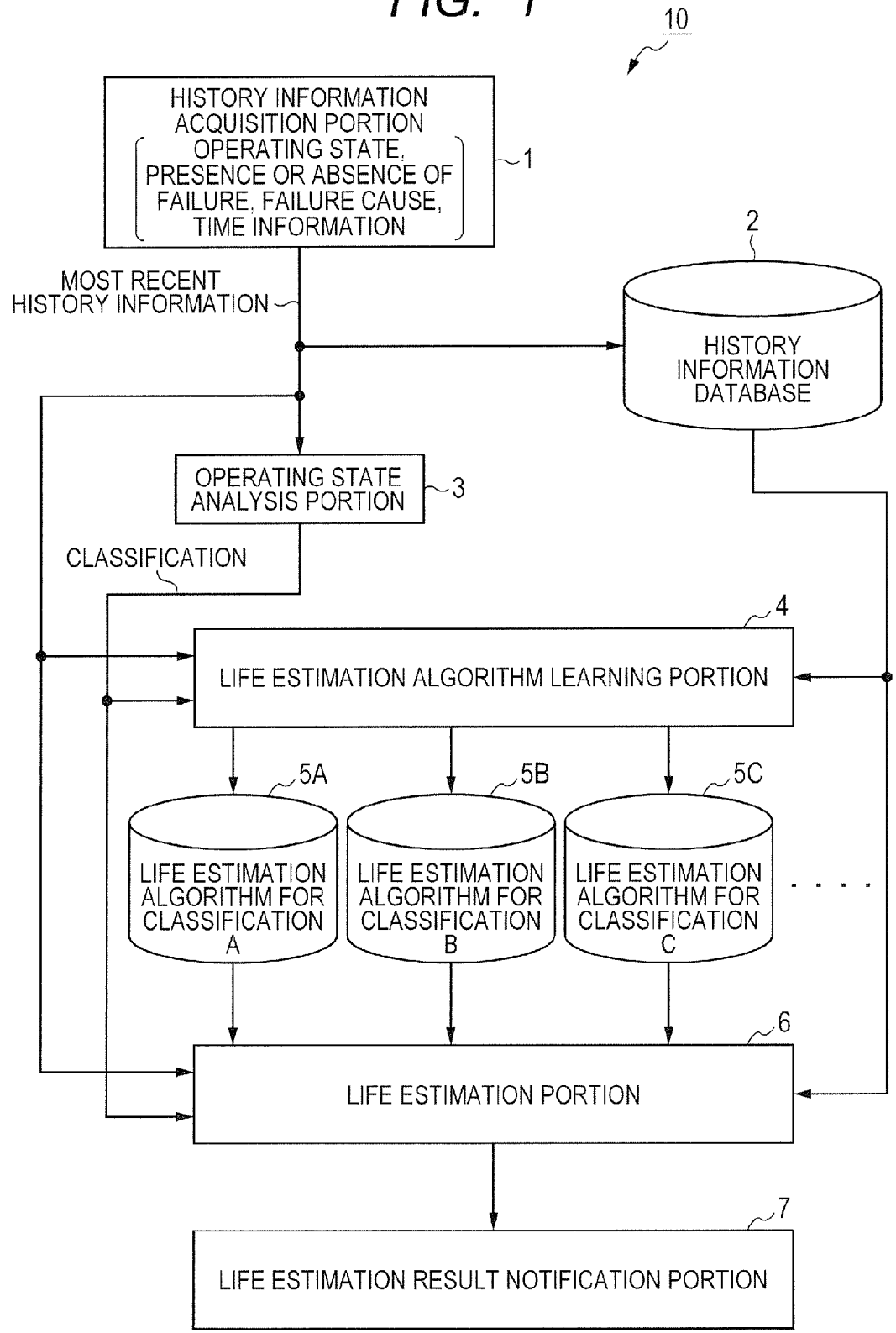
FIG. 1 is a block diagram illustrating a configuration example of a failure estimation apparatus.

Embodiments of the present invention will be described in further detail with reference to the accompanying drawings. Throughout all the drawings to illustrate the embodiments, elements having the same function are designated by the same reference numerals and a detailed description is omitted for simplicity.

First Embodiment

Figure 2:
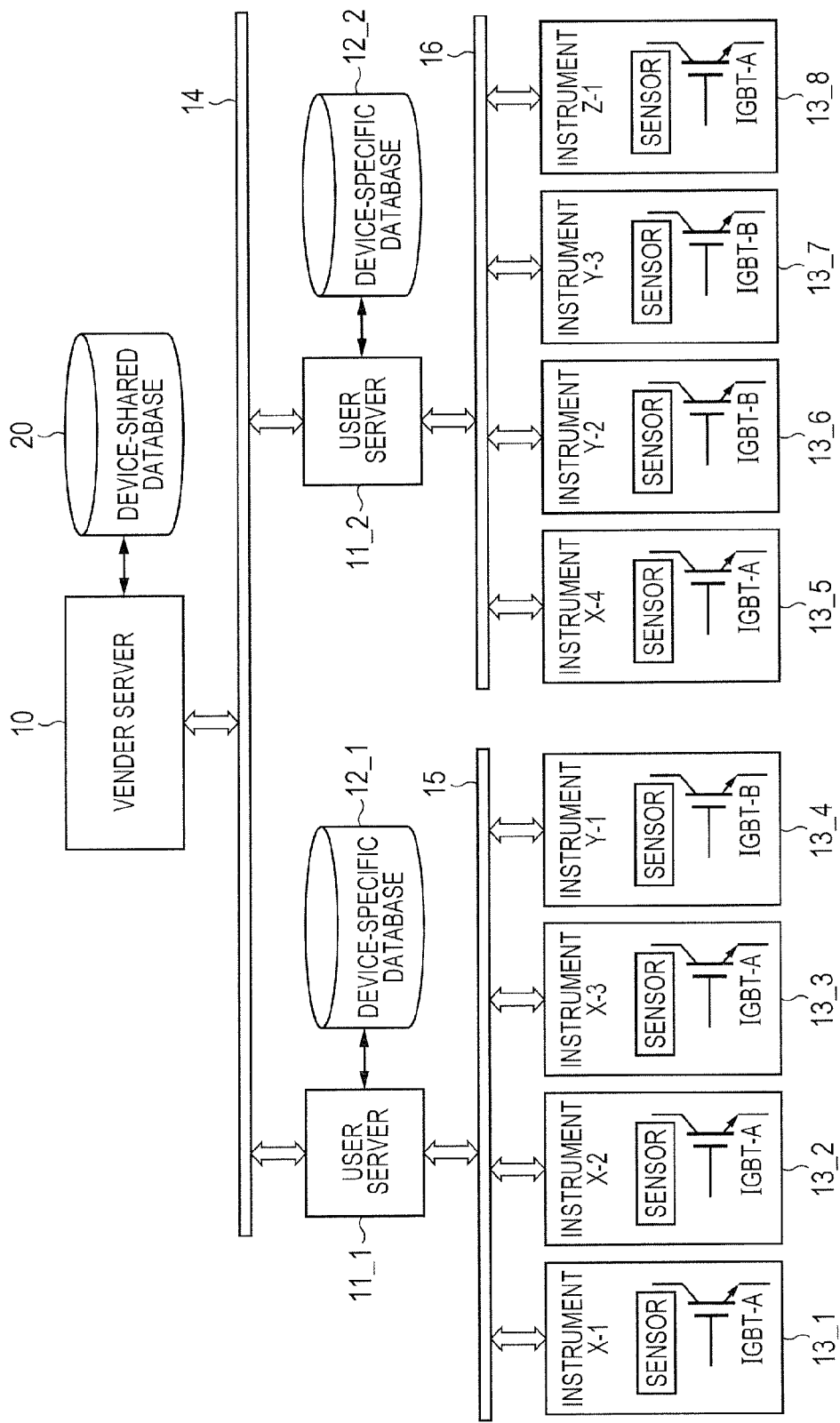
FIG. 2 is a block diagram schematically illustrating a usage example of the failure estimation apparatus.

FIG. 1 is a block diagram illustrating a configuration example of a failure estimation apparatus 10. FIG. 2 is a block diagram schematically illustrating a usage example of the failure estimation apparatus 10.

The description below explains the usage example in FIG. 2. The failure estimation apparatus 10 is available as a server for a vender (semiconductor manufacturer) that provides IGBT as a semiconductor device. The failure estimation apparatus 10 includes a device-shared database 20. The vender server 10 is coupled to user servers 11_1 and 112 via network 14 such as the Internet. In a factory, for example, the user server 11_1 is coupled to a local area network 15 to which instruments 13_1 through 13_4 are coupled. The user server 11_1 includes a device-specific database 12_1. Similarly, the user server 112 is coupled to a network 16 to which instruments 135 through 138 are coupled. The user server 112 includes a device-specific database 122. The instruments 13_1 through 138 are available as FA instruments, for example. The user servers 111 and 112 manage the instruments 13_1 through 138 for maintenance. Normally, an instrument manufacturer provides or a user develops software for the management.

The instruments 13_1 through 138 each include IGBT as a semiconductor device. Sensors monitor IGBT operating states. The sensors include a temperature sensor, a voltage sensor, and a current sensor capable of monitoring IGBT operating states. Other sensors may be mounted to monitor the other parts. Monitoring the sensors produces information about IGBT operating states. The information may be aggregated in each instrument and may be collected in the user servers 11_1 and 11_2. Alternatively, the user servers 11_1 and 11_2 may directly collect and manage the information without allowing each instrument to apply any process such as data processing to the information. The device-specific databases 12_1 and 12_2 store the information about IGBT operating states.

The same type of semiconductor device (IGBT) may be mounted on different apparatuses. The same type of IGBT may be mounted on the same type of instruments but may be used at different locations, in different processes, or under different environments. As illustrated in the drawing, the instruments 13_1 through 13_3 and 13_5 belong to the same type of instrument X and are mounted with the same type of IGBT-A. The instruments 13_4 and 13_7 belong to another type of instrument Y and are mounted with a different type of IGBT-B. The instrument 13_8 belongs to still another type of instrument Z different from the instruments 13_1 through 13_3 and 13_5 but is mounted with IGBT-A equal to these instruments. Suppose the vendor to be a semiconductor manufacturer that supplies IGBT-A. The instruments 13_1 through 13_3 of the same type in the same factory use IGBT-A supplied by the vendor. The instrument 13_5 as the instrument X-4 is used by a different user or at a different location. The same IGBT-A is used for the instrument 138 as the different instrument Z-1. The semiconductor manufacturer can monitor various environments and usage states of the same type of semiconductor devices.

The "same type" may signify the same model name, the same model number, or the same grade if types are assigned to selected grades. Expanding the scope of the "same type" increases the amount of information acquired but tends to weaken the correlation. The scope of the "same type" needs to be configured in consideration of this point. The scope may be reviewed in accordance with an increase in the shipment quantity.

The description below explains the configuration example of the failure estimation apparatus 10 in FIG. 1.

The failure estimation apparatus 10 includes a history information acquisition portion 1, a history information database 2, an operating state analysis portion 3, a life estimation algorithm learning portion 4, life estimation algorithms 5A, 5B, 5C, and so on, a life estimation portion 6, and a life estimation result notification portion 7. The failure estimation apparatus 10 is implemented as a software function operating on a computer. The history information database 2 is configured on a storage device attached to the computer. The storage device attached to the computer or a different storage device stores parameters for the life estimation algorithms 5A, 5B, 5C, and so on. The parameter settles characteristics of each algorithm.

The history information acquisition portion 1 acquires history information about operating states of the semiconductor device from several instruments (13_1 through 13_3, 13_5, and 13_8) mounted with the same type of semiconductor devices (IGBT-A). The history information acquisition portion 1 records the history information in the history information database 2. The history information includes operation information and failure information. The operation information represents chronological operating states of the semiconductor device (IGBT-A) mounted on the instrument during a period between the start of the first operation and a failure occurrence after the instrument is shipped or after major components including the semiconductor device are replaced. The failure information represents why the instrument failed, if applicable. The acquired history information contains time information about the time when an actual operating state was observed or a failure occurred if there is a difference between the time information and the time to have acquired the history information. In this context, "time" or "time information" just needs to represent time information that can be finally converted into the time when an event occurred during the operation time of each instrument. The time information may be available in any format. For example, the number of days may be used as a unit for an item that need not specify hours or minutes. The history information database 2 stores the history information about not only an instrument that operates normally at the time point, but also an instrument that failed and was replaced or discarded.

The history information acquisition portion 1 acquires the most recent history information and transmits it to the history information database 2. The history information acquisition portion 1 appends the most recent history information to the history information about the instrument or the corresponding semiconductor device and transmits the history information to the operating state analysis portion 3. In the context, the "most recent history information" is newly transmitted from an instrument operating at the time point or an instrument that issues the failure information about the first failure occurrence at the time point for the first time.

The operating state analysis portion 3 determines whether or not a failure occurs, based on the most recent history information. If a failure occurs, the operating state analysis portion 3 starts the life estimation algorithm learning portion 4 and allows it to perform learning to update the life estimation algorithms 5A, 5B, 5C, and so on. If no failure occurs, the operating state analysis portion 3 starts the life estimation portion 6 to perform life estimation using the life estimation algorithms 5A, 5B, 5C, and so on. The operating state analysis portion 3 allows the life estimation result notification portion 7 to notify the result.

Operation states of the semiconductor device mounted on the instrument are divided into several classifications. Each classification corresponds to the life estimation algorithms 5A, 5B, 5C, and so on. Actually, the life estimation algorithm is described as a program or a formula. The storage device stores a parameter such as a coefficient that specifies characteristics of the life estimation algorithm.

The operating state analysis portion 3 specifies a classification corresponding to the operating state of the semiconductor device mounted on the instrument targeted at the failure prediction based on operation information about the semiconductor device contained in the history information. The operating state analysis portion 3 may specify a classification also in consideration of the past history information about the targeted instrument. The operating state analysis portion 3 can more accurately specify a classification by including the past history information as well.

The life estimation algorithm learning portion 4 performs learning by updating one of the life estimation algorithms 5A, 5B, 5C, and so on corresponding to the specified classification based on the most recent history information.

The life estimation portion 6 performs life estimation using one of the life estimation algorithms 5A, 5B, 5C, and so on corresponding to the specified classification. The life estimation portion 6 allows the life estimation result notification portion 7 to notify the result.

This enables to improve the estimation accuracy of the life estimation. This is because learning of the life estimation algorithm can collect and use the information about semiconductor devices subject to similar stresses across many types of instruments. The "classification" may be favorably defined based on the magnitude of a stress on the semiconductor device. The life estimation algorithm is optimized for each classification based on the stress magnitude, improving the estimation accuracy. There may be a case where the power cycle test acquires a life estimation curve only under a very stringent stress and performs the life estimation based on the life estimation curve. In comparison with such a case, the failure prediction uses various life estimation curves acquired under various stress conditions. The failure prediction can be performed based on the life estimation curve acquired under the condition approximate to a stress actually applied to the semiconductor device targeted at the failure prediction.

Second Embodiment

The description below explains in detail a failure estimation method included in the failure estimation apparatus 10 described in the first embodiment.

Figure 3:
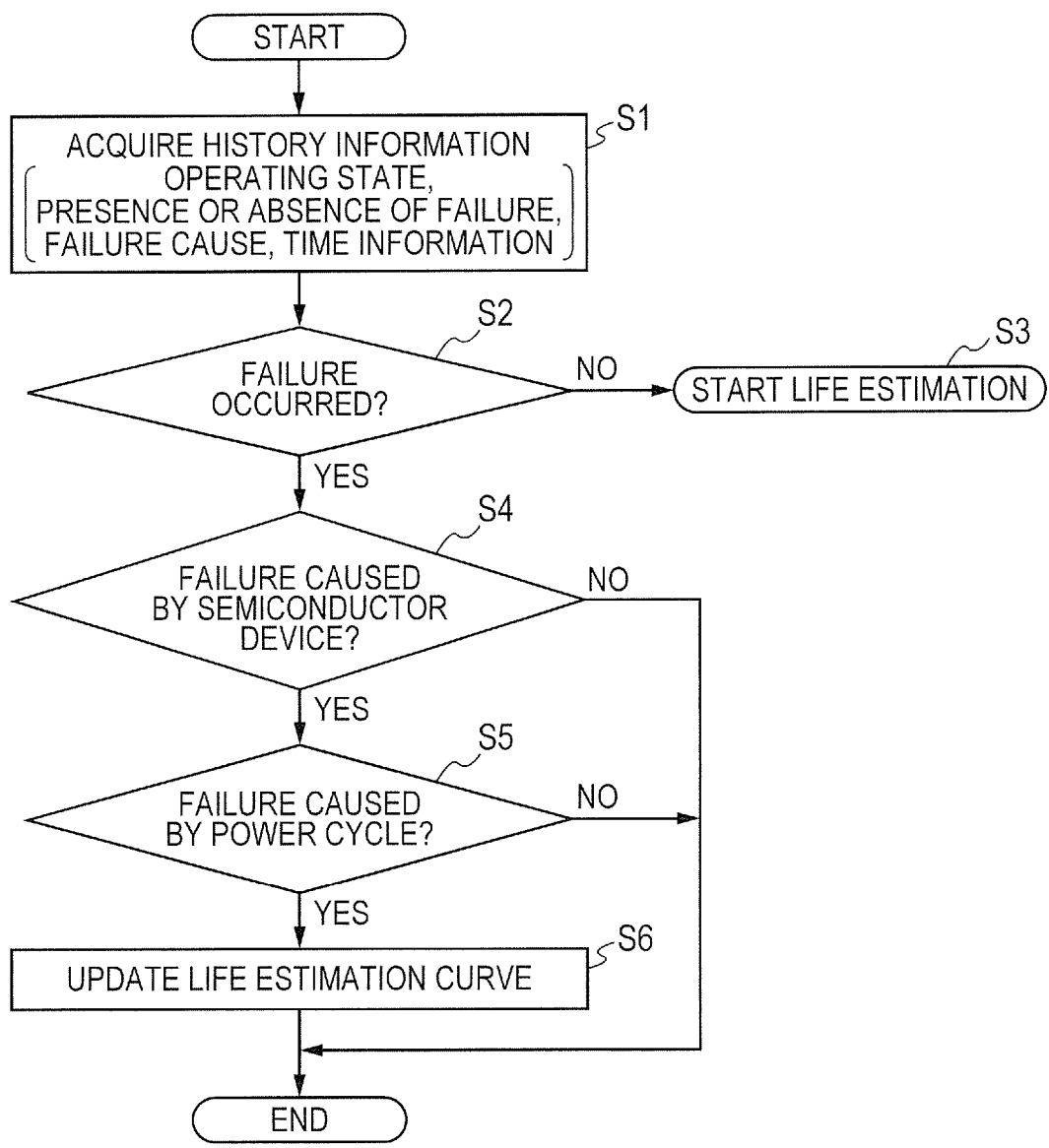
FIG. 3 is a flowchart illustrating a configuration example of a failure estimation method included in the failure estimation apparatus.

FIG. 3 is a flowchart illustrating a configuration example of the failure estimation method included in the failure estimation apparatus 10. Reference to FIG. 1 is also recommended as needed.

The past history information is already stored in the history information database 2. The history information acquisition portion 1 acquires the most recent history information (S1). As described above, the most recent history information is transmitted to the history information database 2 and is appended to the existing history information (unshown). The most recent history information is then transmitted to the operating state analysis portion 3. The method determines whether or not a failure occurs (S2), based on the information that is contained in the history information and concerns the presence or absence of a failure. If no failure occurs, the life estimation starts (S3). If a failure occurs, the method analyzes a failure cause contained in the history information and determines whether or not the failure concerns the semiconductor device (S4). The method also determines whether or not the failure results from a power cycle (S5). The failure may not result from the semiconductor device or may concern the semiconductor device but not result from the power cycle. In this case, the method terminates without learning the life estimation algorithm. In such a situation, the failure may result from an overcurrent or an overvoltage. The failure cannot be used appropriately to update (learn) the life estimation curve. The failure may concern the semiconductor device and result from the power cycle. In this case, the method updates the life estimation curve (S6). The life estimation curve specifies characteristics of the life estimation algorithm. A life estimation coefficient specifies the life estimation curve. The method learns the life estimation algorithm by adaptively changing the life estimation coefficient based on the newly supplied most recent history information.

Figure 4:
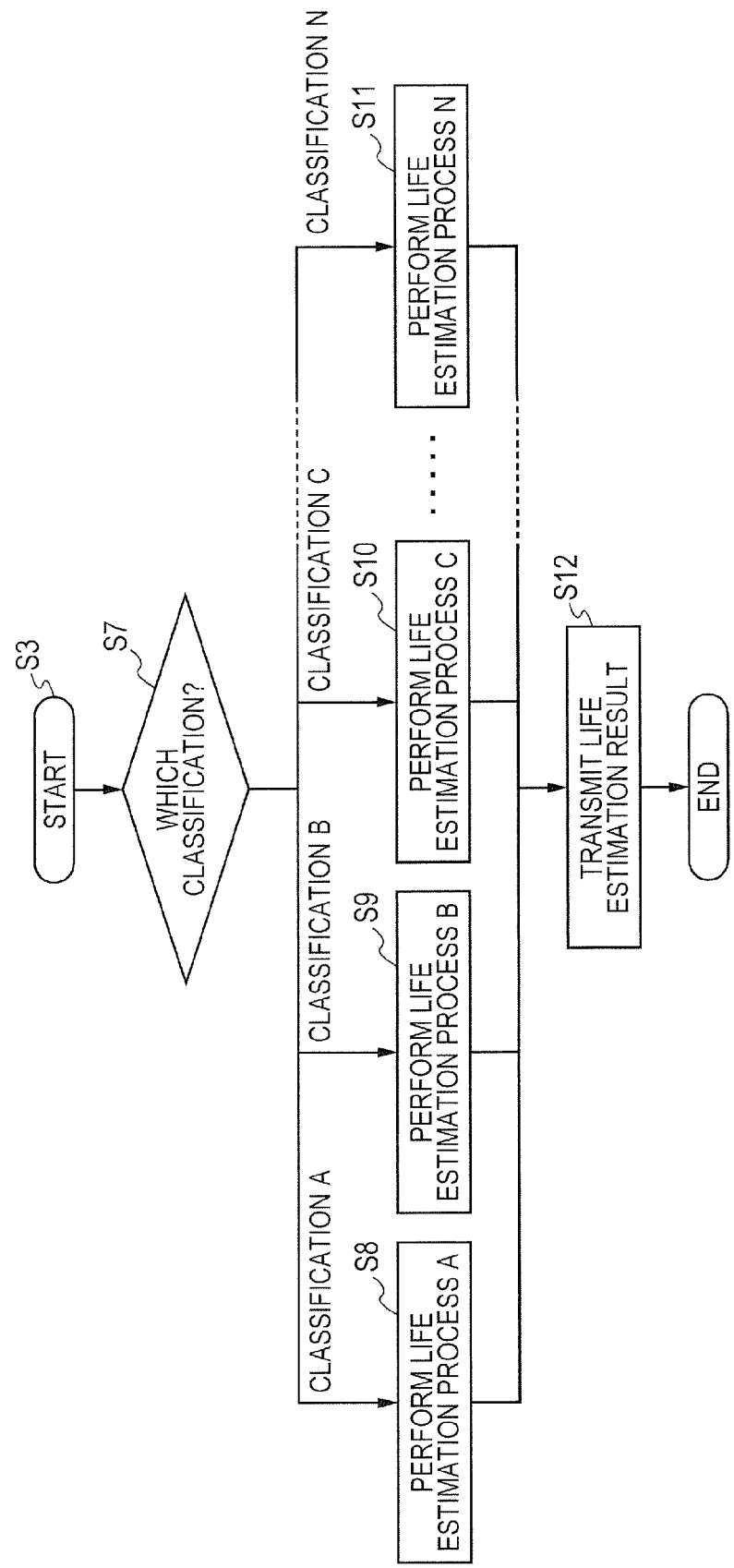
FIG. 4 is a flowchart illustrating an example of life estimation included in the failure estimation method.

FIG. 4 is a flowchart illustrating an example of the life estimation included in the failure estimation method.

The life estimation starts (S3) and proceeds to classification (S7). At the classification (S7), the operating state analysis portion 3 specifies the classification corresponding to the operating state of the semiconductor device mounted on the instrument targeted at the failure prediction based on the operation information about the semiconductor device contained in the acquired history information, more favorably, with reference to the past history information about the targeted instrument as well. The life estimation performs one of life estimation processes (S8 through S11) according to the life estimation algorithm corresponding to the specified classification. The life estimation transmits the result (S12). The life estimation process according to the life estimation algorithm corresponding to the specified classification references the life estimation curve corresponding to the classification.

Figure 5:
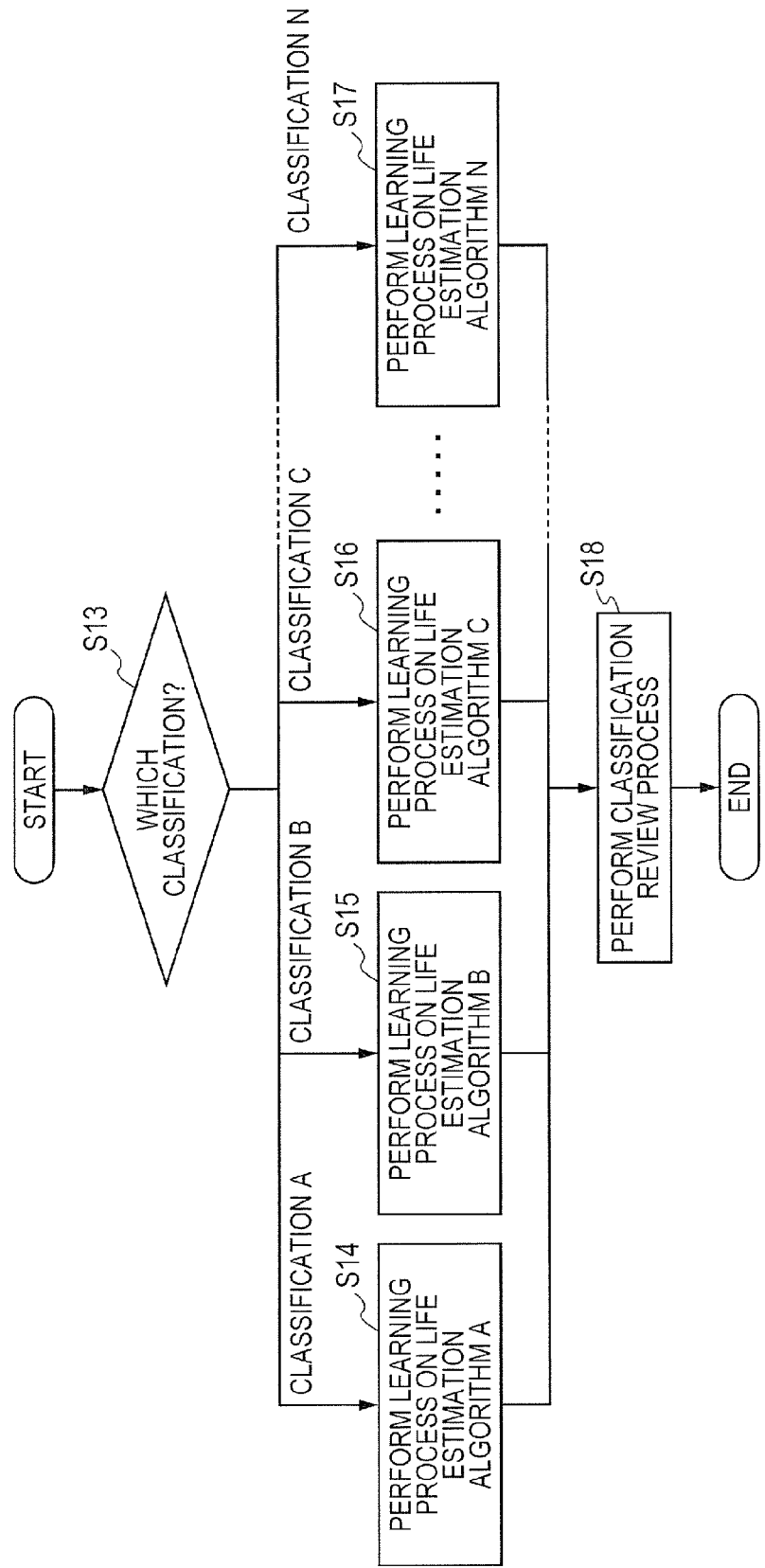
FIG. 5 is a flowchart illustrating an example of a learning process of a life estimation algorithm included in the failure estimation method.

FIG. 5 is a flowchart illustrating an example of a learning process for the life estimation algorithm included in the failure estimation method.

The learning process for the life estimation algorithm starts to perform the classification (S13). The classification (S13) conforms to the classification (S7) in the life estimation. The operating state analysis portion 3 specifies the classification corresponding to the operating state of the semiconductor device mounted on the instrument targeted at the failure prediction based on the operation information about the semiconductor device contained in the acquired history information, more favorably, with reference to the past history information about the targeted instrument as well. The method performs one of learning processes (S14 through S17) for the life estimation algorithm corresponding to the specified classification. A classification review process (S18) may be performed if none of the learning processes (S14 through S17) is inappropriate to learn the life estimation algorithm. The classification review process corrects a classification criterion if it is inappropriate. The classification review process is unnecessary when the classification criterion is universal. The classification review process enables the failure estimation apparatus to autonomously review the classification itself and vary it adaptively. It is favorable to implement the classification review process in addition to the life estimation algorithm learning.

Figure 6:
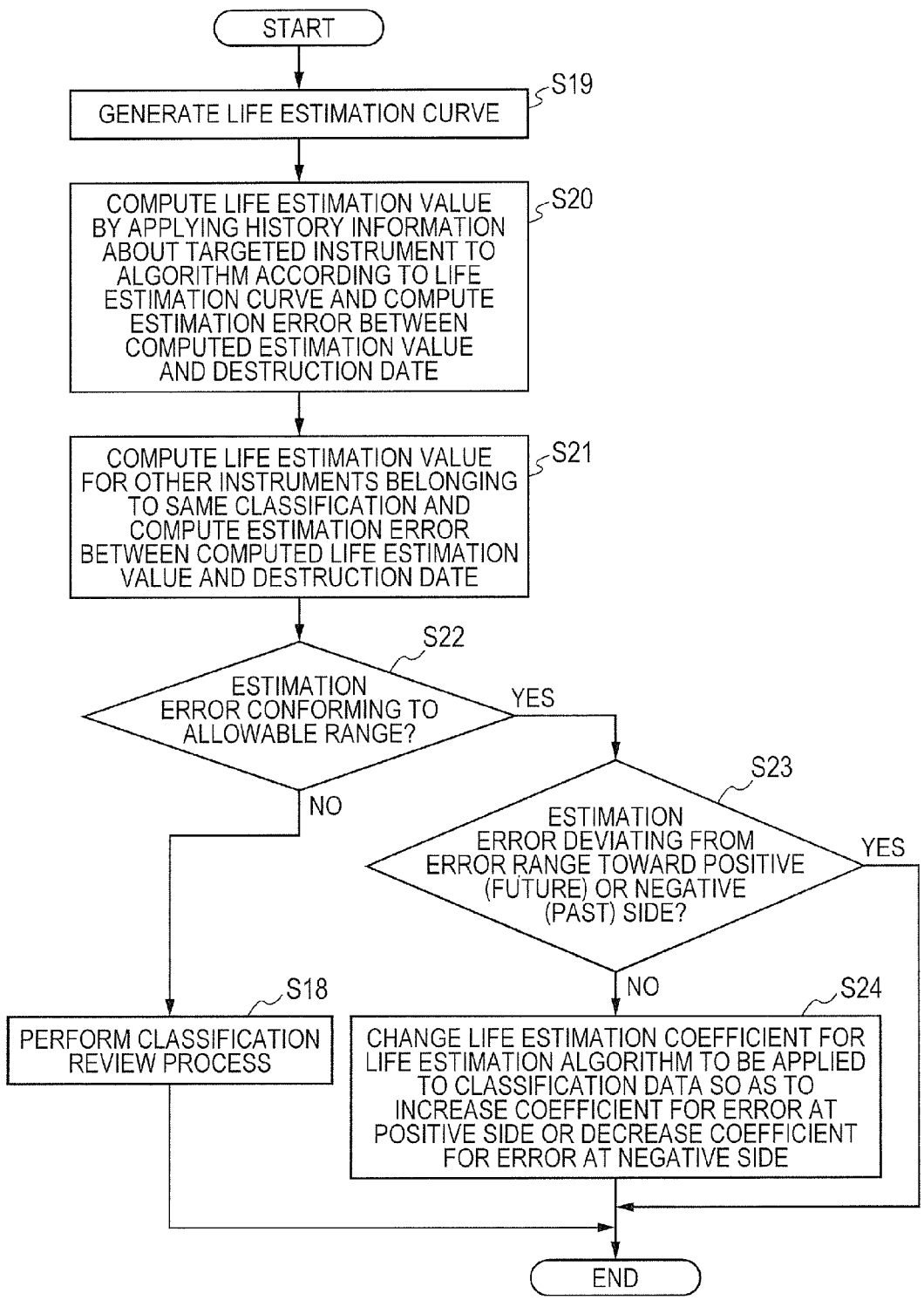
FIG. 6 is a flowchart illustrating in detail a configuration example of the learning process for the life estimation algorithm.

FIG. 6 is a flowchart illustrating in detail a configuration example of the learning process for the life estimation algorithm.

The method generates a life estimation curve from the history information stored in the history information database 2 (S19). The life estimation curve just needs to be generated once and need not be generated each time the most recent history information is input. The life estimation curve is updated as needed. A unique life estimation curve is generated for each classification. A life estimation curve is generated anew when the classification is reviewed.

When supplied with the most recent history information about the instrument targeted at the failure prediction, the method applies the history information about the targeted instrument until that time to the life estimation curve for the corresponding classification to compute a life estimation value (S20). The method also computes an estimation error as a difference between the computed estimation value and a destruction date when the failure actually occurred (S20). The estimation value and the destruction date are represented in the number of operating days elapsed from the date when the operation started. The estimation value and the destruction date may be represented in units of hours or minutes as the operating time elapsed from the time when the operation started.

The method applies the history information about the other instruments categorized as the same classification to the same life estimation curve and thereby computes a life estimation value for each of the instruments. The method computes an estimation error as a difference between the computed life estimation value and a destruction date when each of the instruments actually failed (S21). This can provide a distribution of estimation errors concerning the instruments belonging to the classification when the life estimation was performed using the most recent estimation curve.

Mapping the estimation error concerning the targeted instrument to the acquired distribution of estimation errors enables to evaluate whether or not the estimation error about the targeted instrument is applicable to the distribution of estimation errors concerning the classification. Specifically, the method determines whether or not the estimation error concerning the targeted instrument conforms to an allowable range (S22). The method does not perform the learning process for the life estimation algorithm if the estimation error concerning the targeted instrument deviates from the allowable range. This can prevent improper learning based on history information inappropriate to learn the life estimation algorithm when the failure is not caused by the life or does not result from the semiconductor device. In such a case, the method may perform a classification method review (S18).

If the estimation error concerning the targeted instrument conforms to the allowable range, the method determines whether the estimation error corresponds to the positive side, namely the future direction, or the negative side, namely the past direction (S23). The method changes the life estimation coefficient for the life algorithm to be applied to the classification depending on the result. Namely, the method increases the life estimation coefficient if the estimation error corresponds to the positive side. The method decreases the life estimation coefficient if the estimation error corresponds to the negative side (S24).

As described above, the method appropriate for the numeric operation program is used to learn the life estimation algorithm by increasing or decreasing the life estimation coefficient.

The classification method review (S18) is available through various methods. For example, several ranges concerning one parameter may specify the classification. In such a case, the method can adjust the ranges. As will be described later, the method adjusts a range of temperature differences when the classification is specified based on the range of temperature differences in the temperature change transition. Intensity of the correlation in each classification can be used to evaluate the appropriateness of the classification method or the classification criterion. The classification can be evaluated to be appropriate if the correlation is strong. The classification cannot be evaluated to be appropriate if the correlation is weak because an estimation error is large. The appropriateness of the classification can be evaluated based on the correlation intensity even when the classification using the same operator is changed to the classification using other parameters.

Third Embodiment

A specific embodiment will be further described. The embodiment specifies the classification based on temperature change transition to the semiconductor device.

Figure 7:
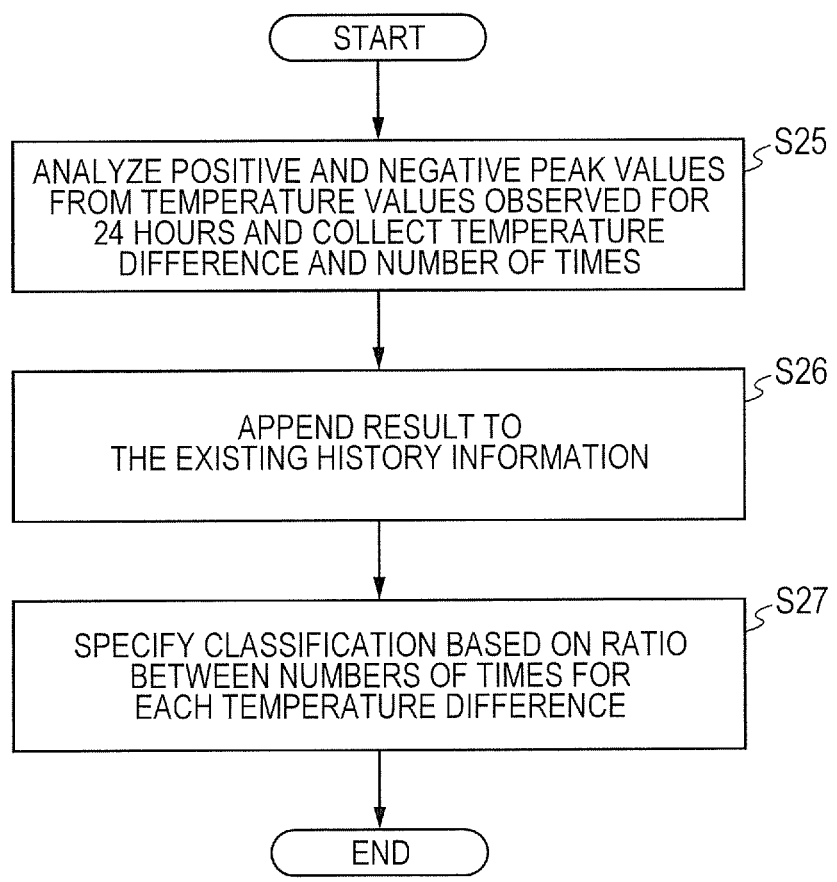
FIG. 7 is a flowchart illustrating a classification example according to temperature change transition.

FIG. 7 is a flowchart illustrating a classification example according to the temperature change transition.

The method observes the temperature of the semiconductor device for a specified period such as 24 hours. The method analyzes a positive peak value and a negative peak value from the observed temperature values. The method collects a temperature difference in temperature increase from the negative peak to the next positive peak, a temperature difference in temperature decrease from the positive peak to the next negative peak, and the number of times the temperature increases and decreases (S25). The collection is repeated every specified period (24 hours). The most recent aggregate result is appended to the existing history information (S26). The method specifies the classification based on a ratio between the numbers of times for each temperature difference (S27). The description below explains in more detail with reference to the other drawings.

Figure 8:
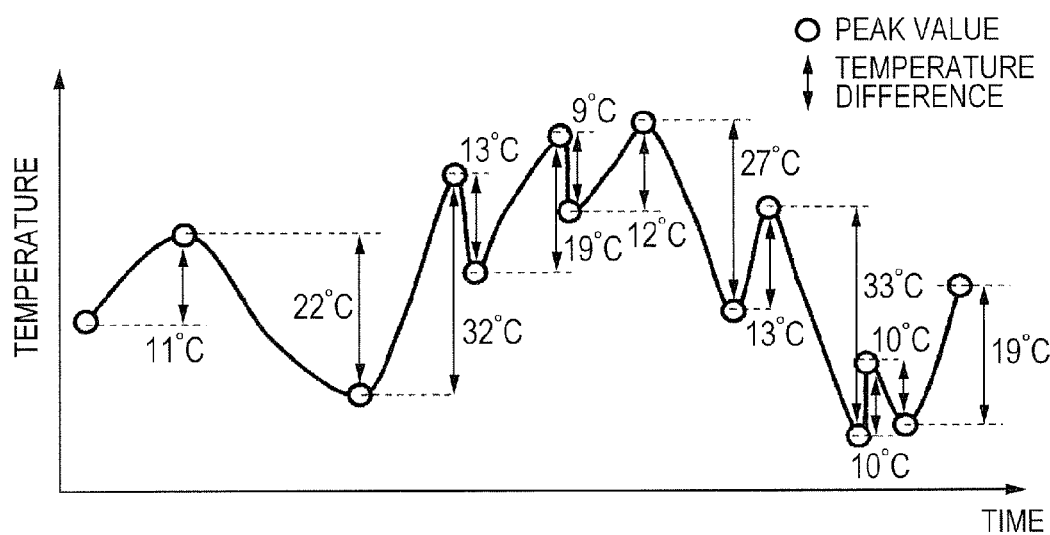
FIG. 8 is an explanatory diagram illustrating the temperature change transition.

FIG. 8 is an explanatory diagram illustrating the temperature change transition. The horizontal axis represents the time. The vertical axis represents the semiconductor device temperature. The semiconductor device temperature can be measured by using a forward voltage in a diode formed on the same chip as the semiconductor device such as IGBT, for example. To measure the semiconductor device temperature, a temperature sensor such as a thermistor may be adjacently placed on a metal base where the semiconductor device such as IGBT is mounted. Temperature-dependent electric characteristics of IGBT may be converted into the temperature. In the drawing, a solid line represents the temperature. A circle represents the temperature peak. A broken line and a two-headed arrow represent a temperature difference. As illustrated in the drawing, the temperature rises by temperature difference 11° C. from the negative peak to the positive peak and then falls by temperature difference 22° C. to the negative peak. The temperature changes are observed during a specified period such as 24 hours to find a frequency distribution of temperature differences and the number of temperature changes in the temperature change transition.

Figure 9:
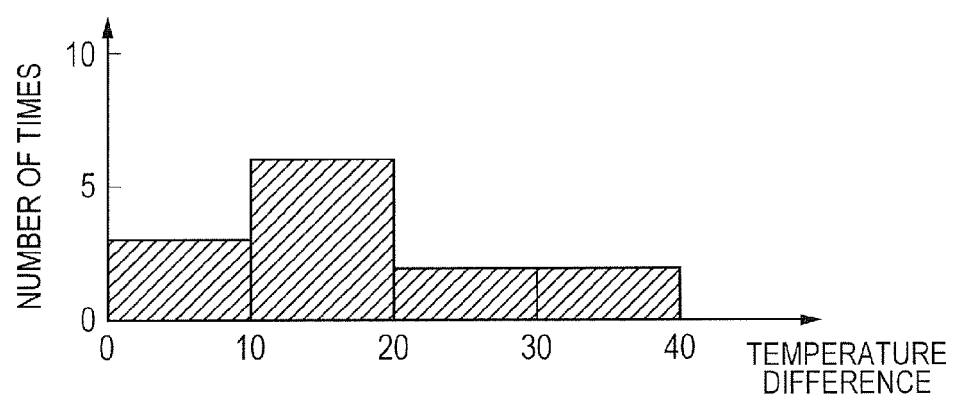
FIG. 9 is an explanatory diagram illustrating a result of aggregating temperature differences and the number of occurrences in the temperature change transition.

FIG. 9 is an explanatory diagram illustrating a result of aggregating temperature differences and the number of occurrences in the temperature change transition. The horizontal axis represents a temperature difference in the temperature change transition. The vertical axis represents the number of temperature changes that occurred. FIG. 9 exemplifies the aggregate result at S25 in FIG. 7. The temperature change from 0° C. to 10° C. occurs three times. The temperature change from 11° C. to 20° C. occurs six times. The temperature change from 21° C. to 30° C. occurs twice. The temperature change from 31° C. to 40° C. occurs twice. Temperature differences are expressed in significant digits with no decimal point. The temperature change from 11° C. to 20° C. signifies a range of temperature higher than or equal to 10.5° C. and lower than 20.5° C. The temperature change from 21° C. to 30° C. signifies a range of temperature higher than or equal to 20.5° C. and lower than 30.5° C. This does not signify the presence of an interval between adjacent temperature ranges.

Figure 10:
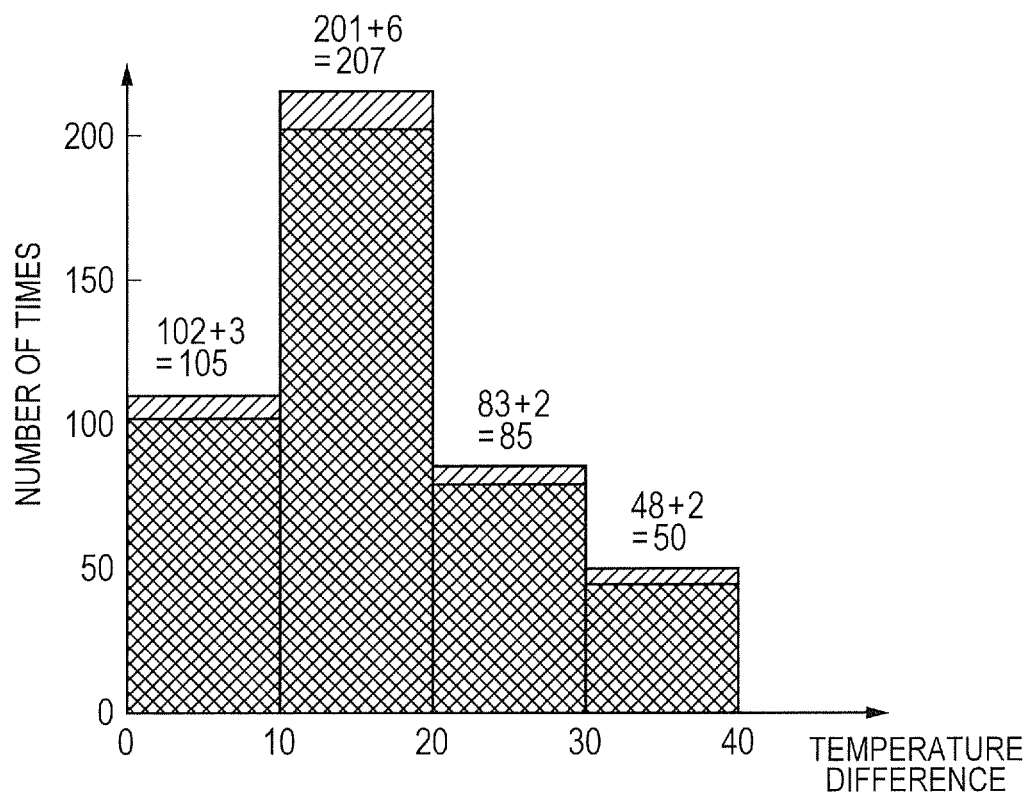
FIG. 10 is an explanatory diagram illustrating a result of adding the result of aggregating temperature differences and the number of occurrences to history information.

FIG. 10 is an explanatory diagram illustrating a result of adding the result of aggregating temperature differences and the number of occurrences to the history information. Similarly to FIG. 9, the horizontal axis represents a temperature difference in the temperature change transition. The vertical axis represents the number of temperature changes that occurred. FIG. 9 provides an example of the result appended to the history information at S26 in FIG. 7. The temperature change from 0° C. to 10° C. occurs 105 times, the sum of 102 times in the past and three times at present. Similarly, the temperature change from 11° C. to 20° C. occurs 207 times, the sum of 201 times in the past and six times at present. The temperature change from 21° C. to 30° C. occurs 85 times, the sum of 83 times in the past and twice at present. The temperature change from 31° C. to 40° C. occurs 50 times, the sum of 48 times in the past and twice at present.

Figure 11:
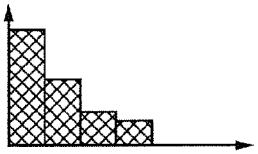
FIG. 11 is an explanatory diagram illustrating an example of classifications according to the temperature change transition.
Figure 11:
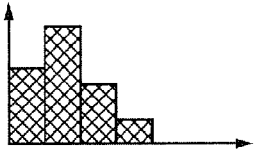
Figure 11:
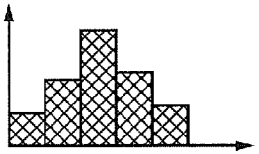
Figure 11:
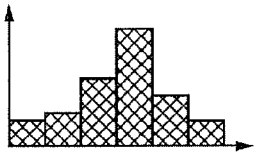

FIG. 11 is an explanatory diagram illustrating an example of classifications according to the temperature change transition. FIG. 11 exemplifies S27 in FIG. 7. The example provides four classifications A through D. Classification A indicates that the temperature most frequently changes from 0° C. to 10° C. Similarly, classification B indicates that the temperature most frequently changes from 11° C. to C. Classification C indicates that the temperature most frequently changes from 21° C. to 30° C. Classification D indicates that the temperature most frequently changes from 31° C. to 40° C. The example in FIG. 10 corresponds to classification B.

Figure 12:
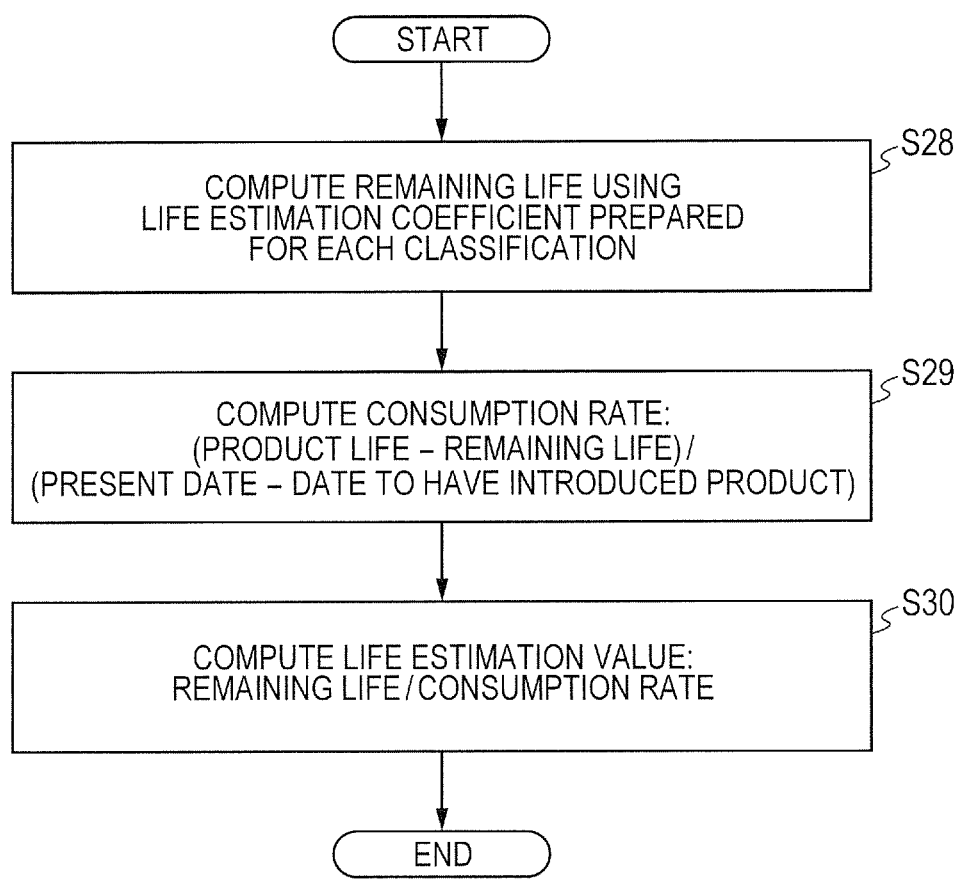
FIG. 12 is a flowchart illustrating a method of computing a life estimation value.

FIG. 12 is a flowchart illustrating a method of computing a life estimation value. The life estimation value is computed when no failure occurs after the most recent history information is acquired and is appended to the existing history information to specify the corresponding classification. The method computes a remaining life using a life estimation coefficient for the specified classification out of the life estimation coefficients prepared for the classifications (S28). The "life" signifies the operating time in units of hours or minutes. The "remaining life" signifies the operating time until a failure occurs. The method computes a consumption rate (S29). The method finds the consumption rate by dividing a result of subtracting the computed remaining life from the product life by the number of days elapsed from the date to have introduced the product up to the present. Finally, the method computes a life estimation value (S30). The method can find the life estimation value as the number of days until a failure occurrence by dividing the remaining life found at S28 by the consumption rate found at S29.

Figures 13, 14:
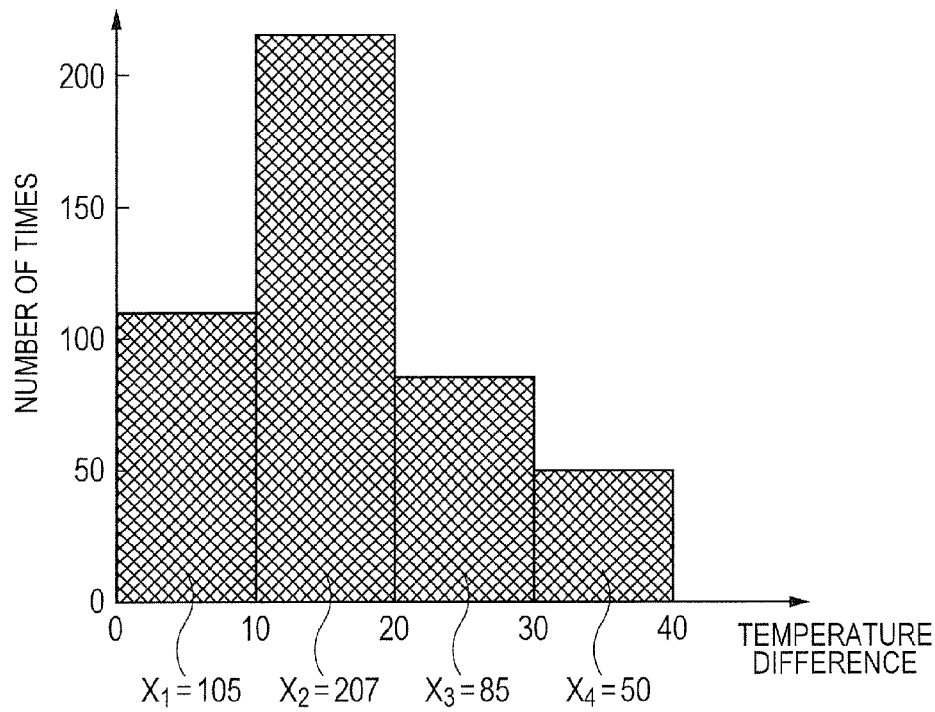
FIG. 13 is an explanatory diagram illustrating history information about aggregating temperature differences and the number of occurrences.
FIG. 14 is an explanatory diagram illustrating an example of computing remaining life.

FIG. 13 is an explanatory diagram illustrating history information about aggregating temperature differences and the number of occurrences. Similarly to FIG. 10, FIG. 13 exemplifies an aggregate result when the most recent aggregate result is added to the history information (S26) and then the classification is specified (S27) in FIG. 7. According to the graph, the example corresponds to classification B.

FIG. 14 is an explanatory diagram illustrating an example of computing the remaining life. The life estimation coefficients are provided for each of the classifications. Classification A is given life estimation coefficients $R_{A1}$, $R_{A2}$, $R_{A3}$, $R_{A4}$, and so on. Similarly, classification B is given life estimation coefficients $R_{B1}$, $R_{B2}$, $R_{B3}$, $R_{B4}$, and so on. Classification C is given life estimation coefficients $R_{C1}$, $R_{C2}$, $R_{C3}$, $R_{C4}$, and so on. Classification D is given life estimation coefficients $R_{D1}$, $R_{D2}$, $R_{D3}$, $R_{D4}$, and so on. According to the example in FIG. 13, the method computes the remaining life for classification B using life estimation coefficients $R_{B1}$, $R_{B2}$, $R_{B3}$, $R_{B4}$, and so on. The remaining life is found by: product life$-R_{B1}X_1-R_{B2}X_2-R_{B3}X_3-R_{B4}X_4$, and so on. $X_1$ denotes the number of times to cause the temperature difference between 0° C. and 10° C. and is represented as $X_1=105$ according to FIG. 3. Similarly, the number of times are represented as $X_2=207$, $X_3=85$, and $X_4=50$. The method can compute remaining life by assigning these values. The method can further compute the life estimation value according to the flowchart in FIG. 12.

The description below explains an effect of the third embodiment. The same applies to the first and second embodiments.

FIG. 15 is an explanatory diagram illustrating estimation accuracy. The horizontal axis represents the time or the number of days. The vertical axis represents a life level of the semiconductor device due to a cause such as desoldering. An initial level is applicable immediately after the semiconductor device is shipped or mounted. A related art uses a worst design value for the initial level as a start point to form a life estimation curve that assumes a constant stress. The initial level is represented by a dot-and-dash line in FIG. 15. The vertical axis contains a warning level immediately before a failure occurrence. The life estimation curve according to the related art sets the life estimation value to tae0 equal to the date (time) that reaches the warning level before a date (time) when an actual failure is estimated to occur. This estimation is based on the power cycle test and therefore assumes a stress applied to the semiconductor device to be a constant value approximate to the estimated maximum value. Contrastingly, as indicated by a broken line, an actual product life is subject to a heavy load or a light load depending on periods. The life level decreases steeply during a heavy-load period but decreases gradually during a light-load period. The drawing illustrates a period during which the life level decreases more steeply than the life based on the power cycle test. Actually, however, such a period occurs very rarely. This is because a heavy load is assumed to be approximate to the maximum value that may be used for the power cycle test. The actual product life indicates date (time) tx of failure occurrence much later than date (time) tae0 when the estimation according to the related art issues the warning. As described in the first through third embodiments, the estimation algorithm can approximate to the actual product life according to the first generation, the second generation, the third generation, and so on while the learning of the life estimation curve proceeds. The life estimation value can thereby gradually approximate to warning date (time) tai as an ideal target for the actual product life by using date (time) tae1 according to the first-generation estimation algorithm, date (time) tae2 according to the second-generation estimation algorithm, and date (time) tae3 according to the third-generation estimation algorithm. The estimation algorithms can further improve the estimation accuracy compared to the failure estimation using the life estimation curve based on the power cycle test.

While there have been described specific preferred embodiments of the present invention, it is to be distinctly understood that the present invention is not limited thereto but may be otherwise variously embodied within the spirit and scope of the invention.

The life estimation can be more accurate in consideration of the steepness of temperature changes as well as the number of temperature changes, for example. The steepness of temperature changes can be incorporated by adding the time from one peak to the next peak to the history information.

What is claimed is:

1. A failure estimation apparatus that includes a history information database storing history information about a plurality of instruments mounted with the same type of semiconductor device and performs failure estimation on a targeted instrument mounted with a semiconductor device whose type equals the type, wherein the history information contains operation information and failure information; wherein the operation information indicates a chronological operating state of the semiconductor device mounted on the instruments; wherein the failure information indicates a failure cause of a failed instrument; and wherein the operating state is categorized into a plurality of classifications;

the failure estimation apparatus comprises:

a memory that stores one of a program and a formula to implement a life estimation algorithm corresponding to each of the classifications; and a processor configured to:

acquire most recent history information about the targeted instrument;

specify classification corresponding to an operating state of a semiconductor device mounted on the targeted instrument based on operation information contained in the acquired most recent history information;

update a life estimation algorithm corresponding to the specified classification based on the acquired most recent history information when determining that the semiconductor device fails based on the failure information contained in the acquired most recent history information;

perform life estimation using the updated life estimation algorithm corresponding to the specified classification when determining that no failure occurs based on the failure information contained in the acquired most recent history information;

compute an estimation error using time information indicating an actual failure occurrence of the targeted instrument, and update the life estimation coefficient so as to decrease the estimation error; and notify a result of the life estimation.

2. The failure estimation apparatus according to claim 1, wherein the instruments include different types of instruments and a criterion for the classification is applicable irrespective of instrument type differences.

3. The failure estimation apparatus according to claim 2, wherein the processor is further configured to specify the classification based on a criterion using magnitude of a stress applied to the semiconductor device.

4. The failure estimation apparatus according to claim 3, wherein the stress corresponds to a temperature difference between peak temperature and next peak temperature in temperature change transition and a criterion for the classification is specified in a temperature range in which the temperature difference most frequently occurs during a specified period in terms of occurrence frequency distribution.

5. The failure estimation apparatus according to claim 1, wherein the life estimation algorithm is based on a life estimation curve specified by a life estimation coefficient and the processor is further configured to compute a life estimation value by adding the life estimation coefficient as a weight to operation information representing a chronological operating state of the semiconductor device; and wherein, when determining a failure of the targeted instrument conforms to the failure of the semiconductor device, the processor is further configured to compute a life estimation value for the targeted instrument from the life estimation coefficient and the operation information indicating the chronological operating state of the semiconductor device in the past up to failure occurrence of the targeted instrument.

6. The failure estimation apparatus according to claim 5, wherein the processor is further configured to not update the life estimation coefficient when the estimation error is outside a specified allowable range.

7. The failure estimation apparatus according to claim 6, wherein, when determining a failure of the targeted instrument conforms to the failure of the semiconductor device, the processor is further configured to compute the life estimation value with respect to each of a plurality of other already failed instruments belonging to the same classification as the targeted instrument from the life estimation coefficient and chronological operation information up to failure occurrence of the other instruments, computes the estimation error using time information indicating an actual failure occurrence of the other instruments, and finds the allowable range based on distribution of a plurality of estimation errors computed for each of the other instruments.

8. The failure estimation apparatus according to claim 7, wherein the processor is further configured to review a criterion for the classification when distribution of a plurality of estimation errors computed for each of the other instruments exceeds specified magnitude.

9. The failure estimation apparatus according to claim 1, further comprising:
an interface to couple with a network,
wherein the failure estimation apparatus uses the interface to acquire the history information via the network and notify a result of the life estimation.

10. The failure estimation apparatus according to claim 9, wherein the failure estimation apparatus uses the interface to acquire the history information from a user server coupled to the network and notify the user server of a result of the life estimation.

11. A failure estimation method that is based on history information about a plurality of instruments mounted with the same type of semiconductor device and performs failure estimation on a targeted instrument mounted with a semiconductor device whose type equals the type, the method being implemented by computer software, wherein the history information contains operation information and failure information; wherein the operation information indicates a chronological operating state of the semiconductor device mounted on the instruments; wherein the failure information indicates a failure cause of a failed instrument; and wherein the operating state is categorized into a plurality of classifications; the failure estimation method comprising the steps of:
storing one of a program and a formula to implement a life estimation algorithm corresponding to each of the classifications;
acquiring most recent history information about the targeted instrument;
specifying a classification corresponding to an operating state of the semiconductor device based on the operation information contained in acquired history information;
updating a life estimation algorithm corresponding to a specified classification based on the acquired history information when determining that the semiconductor device fails based on the failure information contained in the acquired history information; and
performing life estimation using the life estimation algorithm corresponding to the specified classification when determining that no failure occurs based on the failure information contained in the acquired history information;
wherein the failure estimation method further computes an estimation error using time information indicating an actual failure occurrence of the targeted instrument, and updates the life estimation coefficient so as to decrease the estimation error.

12. The failure estimation method according to claim 11, wherein the instruments include different types of instruments and a criterion for the classification is applicable irrespective of instrument type differences.

13. The failure estimation method according to claim 12, wherein the classifications are specified based on a criterion using magnitude of a stress applied to the semiconductor device.

14. The failure estimation method according to claim 13, wherein the stress corresponds to a temperature difference between peak temperature and next peak temperature in temperature change transition and a criterion for the classification is specified in a temperature range in which the temperature difference most frequently occurs during a specified period in terms of occurrence frequency distribution.

15. The failure estimation method according to claim 11, wherein the life estimation algorithm is based on a life estimation curve specified by the life estimation coefficient and computes a life estimation value by adding the life estimation coefficient as a weight to operation information representing a chronological operating state of the semiconductor device; wherein, when determining a failure of the targeted instrument conforms to a failure of the semiconductor device, the failure estimation method computes a life estimation value for the targeted instrument from the life estimation coefficient and the operation information indicating the chronological operating state of the semiconductor device in the past up to failure occurrence of the targeted instrument.

16. The failure estimation method according to claim 15, wherein the failure estimation method does not update the life estimation coefficient when the estimation error is outside a specified allowable range.

17. The failure estimation method according to claim 16, wherein, when determining the failure of the targeted instrument conforms to the failure of the semiconductor device, the failure estimation method computes the life estimation value with respect to each of a plurality of other already failed instruments belonging to the same classification as the targeted instrument from the life estimation coefficient and chronological operation information up to failure occurrence of the other instruments, computes the estimation error using time information indicating an actual failure occurrence of the other instruments, and finds the allowable range based on distribution of a plurality of estimation errors computed for each of the other instruments.

18. The failure estimation method according to claim 17, wherein the failure estimation method reviews a criterion for the classification when distribution of a plurality of estimation errors computed for each of the other instruments exceeds specified magnitude.

* * * * *